United States Patent
Jeon et al.

(10) Patent No.: US 11,765,939 B2
(45) Date of Patent: Sep. 19, 2023

(54) DISPLAY DEVICE

(71) Applicant: Samsung Display Co., Ltd., Yongin-si (KR)

(72) Inventors: Sang Jin Jeon, Hwaseong-si (KR); Cheol-Gon Lee, Suwon-si (KR); Sang-Uk Lim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 187 days.

(21) Appl. No.: 17/100,160

(22) Filed: Nov. 20, 2020

(65) Prior Publication Data

US 2021/0074786 A1  Mar. 11, 2021

Related U.S. Application Data

(63) Continuation of application No. 16/398,193, filed on Apr. 29, 2019, now Pat. No. 10,847,595.

(30) Foreign Application Priority Data

Jun. 25, 2018 (KR) .................. 10-2018-0072568

(51) Int. Cl.
*H10K 59/121* (2023.01)
*G09G 3/3225* (2016.01)
(Continued)

(52) U.S. Cl.
CPC ....... *H10K 59/1216* (2023.02); *G09G 3/3225* (2013.01); *H10K 59/126* (2023.02);
(Continued)

(58) Field of Classification Search
None
See application file for complete search history.

(56) References Cited

U.S. PATENT DOCUMENTS 7,057,588 B2   6/2006  Asano et al.
8,054,250 B2   11/2011 Kim
(Continued)

FOREIGN PATENT DOCUMENTS

KR   10-2007-0003812   1/2007
KR   10-0739334        7/2007
(Continued)

OTHER PUBLICATIONS

Notice of Allowance dated Jul. 21, 2020, issued in U.S. Appl. No. 16/398,193.
(Continued)

*Primary Examiner* — Evren Seven
(74) *Attorney, Agent, or Firm* — H.C. Park & Associates, PLC

(57) ABSTRACT

A display device includes a substrate; an active pattern disposed on the substrate; a first insulating layer; a first conductive layer disposed on the first insulating layer and having a driving gate electrode; a second insulating layer; a second conductive layer disposed on the second insulating layer and having a first storage electrode; a third insulating layer; a third conductive layer disposed on the third insulating layer and having a second storage electrode; and a light-emitting element disposed on the third conductive layer, wherein the second storage electrode overlaps the first storage electrode via the third insulating layer to form a first capacitor, the first storage electrode overlaps the driving gate electrode via the second insulating layer to form a second capacitor, and the driving gate electrode, the first storage electrode, and the second storage electrode at least partially overlap each other.

10 Claims, 6 Drawing Sheets

(51) Int. Cl.
*H10K 59/126* (2023.01)
*H10K 59/131* (2023.01)
*H01L 27/12* (2006.01)

(52) U.S. Cl.
CPC ....... *H10K 59/1213* (2023.02); *H10K 59/131* (2023.02); *G09G 2300/0426* (2013.01); *G09G 2320/0233* (2013.01); *G09G 2320/0242* (2013.01); *H01L 27/1255* (2013.01)

(56) References Cited

U.S. PATENT DOCUMENTS

| | | | |
|---|---|---|---|
| 9,666,657 B2 | 5/2017 | Cho | |
| 10,062,743 B2 | 8/2018 | Lee et al. | |
| 10,566,402 B2 | 2/2020 | Cho et al. | |
| 10,741,126 B2* | 8/2020 | Choi | G09G 3/3233 |
| 2009/0174699 A1 | 7/2009 | Fish et al. | |
| 2014/0034923 A1* | 2/2014 | Kim | H10K 59/123 |
| | | | 257/40 |
| 2015/0179724 A1 | 6/2015 | Lee et al. | |
| 2015/0243722 A1 | 8/2015 | Kwon et al. | |
| 2016/0071888 A1 | 3/2016 | Park et al. | |
| 2017/0125500 A1* | 5/2017 | Kim | H01L 27/3248 |
| 2017/0154944 A1 | 6/2017 | Kim et al. | |
| 2017/0294497 A1 | 10/2017 | Lius et al. | |
| 2017/0317155 A1 | 11/2017 | Oh et al. | |
| 2017/0338252 A1 | 11/2017 | Lee et al. | |
| 2017/0358605 A1 | 12/2017 | Choi et al. | |
| 2018/0033849 A1 | 2/2018 | Noh et al. | |
| 2018/0062105 A1* | 3/2018 | Lius | H01L 27/1251 |
| 2018/0069127 A1 | 3/2018 | Yang | |
| 2018/0114823 A1 | 4/2018 | Lee et al. | |
| 2018/0175077 A1 | 6/2018 | Koo et al. | |
| 2018/0182302 A1* | 6/2018 | Yoo | G09G 3/3233 |
| 2018/0212016 A1 | 7/2018 | Choi et al. | |
| 2019/0088206 A1* | 3/2019 | Lin | G09G 3/3266 |
| 2019/0280018 A1 | 9/2019 | Song et al. | |

FOREIGN PATENT DOCUMENTS

| | | |
|---|---|---|
| KR | 10-2016-0084549 | 7/2016 |
| KR | 10-2017-0023271 | 3/2017 |
| KR | 10-2017-0119270 | 10/2017 |
| KR | 10-2017-0127602 | 11/2017 |

OTHER PUBLICATIONS

Request for the submission of an opinion dated Jan. 25, 2023, issued to Korean Patent Application No. 10-2018-0072568.
Notice of Allowance dated Jul. 3, 2023 issued to Korean Patent Application No. 10-2018-0072568.

* cited by examiner

DISPLAY DEVICE

CROSS-REFERENCE TO RELATED APPLICATIONS

This application is a Continuation of U.S. patent application Ser. No. 16/398,193, filed on Apr. 29, 2019, and claims priority from and the benefit of Korean Patent Application No. 10-2018-0072568, filed on Jun. 25, 2018, each of which is hereby incorporated by reference for all purposes as if fully set forth herein.

BACKGROUND

Field

Exemplary implementations of the invention relate generally to a display device and, more particularly, to the pixels used in the display device.

Discussion of the Background

A display device is a device for displaying an image, and recently, a light emitting diode display has attracted attention as a self-light emitting display device.

The light emitting diode display has a self-emitting characteristic and thus does not require a separate light source, unlike the liquid crystal display, so that thickness and weight thereof may be reduced. Further, the light emitting diode display shows high quality characteristics such as low power consumption, high luminance, and high response speed.

In general, the light emitting diode display includes a substrate, a plurality of thin film transistors disposed on the substrate, a plurality of insulating layers disposed between wires configuring the thin film transistor, and a light-emitting element connected to the thin film transistor, and for example, the light-emitting element may include an organic light emitting element.

The above information disclosed in this Background section is only for understanding of the background of the inventive concepts, and, therefore, it may contain information that does not constitute prior art.

SUMMARY

Display devices constructed according to the principles and exemplary implementations of the invention have a pixel structure that is capable of increasing the resolution of the display and/or reducing the area required for the pixels. For example, each pixel may include first and second overlapping capacitors, thereby reducing the area occupied by one pixel PX and creating a pixel structure with high resolution.

According to other features of the invention, the leakage current due to the emitted light may be prevented from being generated or may be reduced, such that display defects such as a luminance change of the image and a color coordinate change may be prevented or reduced.

A display device according to an exemplary embodiment includes: a substrate; an active pattern disposed on the substrate and comprising a semiconductor material; a first insulating layer disposed on the active pattern; a first conductive layer disposed on the first insulating layer and having a driving gate electrode, a first scan line, a second scan line, and a control line; a second insulating layer disposed on the first conductive layer; a second conductive layer disposed on the second insulating layer and having a first storage electrode; a third insulating layer disposed on the second conductive layer; a third conductive layer disposed on the third insulating layer and having a second storage electrode; and a light-emitting element disposed on the third conductive layer, wherein the active pattern comprises a channel region and a first conductive region, the first storage electrode is electrically connected to the first conductive region, the second storage electrode overlaps the first storage electrode via the third insulating layer to form a first capacitor, the first storage electrode overlaps the driving gate electrode via the second insulating layer to form a second capacitor, and the driving gate electrode, the first storage electrode, and the second storage electrode at least partially overlap each other.

The driving gate electrode, the first storage electrode, and the second storage electrode may be disposed between the second scan line and the control line.

The channel region of the active pattern may comprise a channel region of a third transistor overlapping the first scan line, and a channel region of a fifth transistor overlapping the second scan line, and the first conductive region may be disposed between the first scan line and the second scan line, and is connected to the channel region of the third transistor and the channel region of the fifth transistor.

The first storage electrode comprises an extension which may be electrically connected to the first conductive region, and the extension may intersect the second scan line.

A driving voltage line transmitting a driving voltage and intersecting the first scan line, the second scan line, and the control line may be further comprised, the active pattern may further comprise a second conductive region electrically connected to the driving voltage line, and the second storage electrode may be electrically connected to the second conductive region to receive the driving voltage.

The channel region of the active pattern may comprise a channel region of a first transistor overlapping the driving gate electrode, and the second conductive region may be disposed between the second scan line and the control line, and may be connected to the channel region of the first transistor and the channel region of the fifth transistor.

A data line transmitting a data signal and intersecting the first scan line, the second scan line, and the control line may be further comprised, and the third transistor may be electrically connected to the data line to receive the data signal.

The driving voltage line may comprise a first part intersecting the first scan line and a protrusion extending in a different direction from an extending direction of the main part, and the protrusion may overlap the first conductive region.

A display device according to an exemplary embodiment comprises: a substrate; an active pattern disposed on the substrate and including a semiconductor material; a first insulating layer disposed on the active pattern; a first conductive layer disposed on the first insulating layer and having a driving gate electrode, a first scan line, a second scan line, and a control line; a second insulating layer disposed on the first conductive layer; a second conductive layer disposed on the second insulating layer and having a first storage electrode; a third insulating layer disposed on the second conductive layer; a third conductive layer disposed on the third insulating layer and having a second storage electrode; a driving voltage line transmitting a driving voltage and intersecting the first scan line, the second scan line, and the control line; and a light-emitting element disposed on the driving voltage line, wherein the active pattern comprises a channel region and a first conductive region, the second storage electrode is electrically connected to the first conductive region, the first conductive region is electrically connected to the driving voltage line, the second storage electrode overlaps the first storage electrode via the third insulating layer to form a first capacitor, the first storage electrode overlaps the driving gate electrode via the second insulating layer to form a second capacitor, and the driving gate electrode, the first storage electrode, and the second storage electrode at least partially overlap each other.

The driving gate electrode, the first storage electrode, and the second storage electrode may be disposed between the second scan line and the control line.

The channel region of the active pattern may comprise a channel region of a first transistor overlapping the driving gate electrode and a channel region of a fifth transistor overlapping the second scan line, and the first conductive region may be disposed between the second scan line and the control line, and may be connected to the channel region of the first transistor and a channel region of a fourth transistor.

A first part where the second storage electrode is electrically connected to the first conductive region and a second part where the driving voltage line is electrically connected to the first conductive region may be separated from each other.

The active pattern may further comprise a second conductive region separated from the first conductive region, and the first storage electrode may be electrically connected to the second conductive region.

The channel region of the active pattern may comprise a channel region of a third transistor overlapping the first scan line, and a channel region of a fifth transistor overlapping the second scan line, and the second conductive region may be disposed between the first scan line and the second scan line, and may be connected to the channel region of the third transistor and the channel region of the fifth transistor.

The first storage electrode comprises an extension which may be electrically connected to the second conductive region, and the extension may intersect the second scan line.

A data line transmitting a data signal and intersecting the first scan line, the second scan line, and the control line may be further comprised, and the third transistor may be electrically connected to the data line to receive the data signal.

The driving voltage line may comprise a first part intersecting the first scan line, and a protrusion extending in a different direction from an extending direction of the first part, and the protrusion may overlap the second conductive region.

A display device according to an exemplary embodiment comprises: a substrate; an active pattern disposed on the substrate and including a semiconductor material; and a first conductor, a second conductor, and a third conductor that are disposed on the active pattern and in different layers, wherein the active pattern has a channel region, a first conductive region, and a second conductive region separated from the first conductive region, the second conductor is electrically connected to the first conductive region, the third conductor is electrically connected to the second conductive region, the third conductor overlaps the second conductor to form a first capacitor, the second conductor overlaps the first conductor to form a second capacitor, and the first conductor, the second conductor, and the third conductor at least partially overlap each other.

A first scan line, a second scan line, and a control line that are disposed in a same layer as the first conductor may be further comprised, the channel region of the active pattern may have a first channel region overlapping the first conductor, a second channel region overlapping the second scan line, a third channel region overlapping the first scan line, a fourth channel region overlapping the control line, and a fifth channel region overlapping the second scan line, the second conductive region may be connected to the first channel region and the fifth channel region, and the first conductive region may be connected to the fifth channel region and the third channel region.

The first conductive region may be disposed between the first scan line and the second scan line, and the second conductive region may be disposed between the second scan line and the control line.

According to the exemplary embodiments of the present disclosure, a display device having a pixel structure that is capable of increasing resolution may be provided.

It is to be understood that both the foregoing general description and the following detailed description are exemplary and explanatory and are intended to provide further explanation of the invention as claimed.

Additional features of the inventive concepts will be set forth in the description which follows, and in part will be apparent from the description, or may be learned by practice of the inventive concepts.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
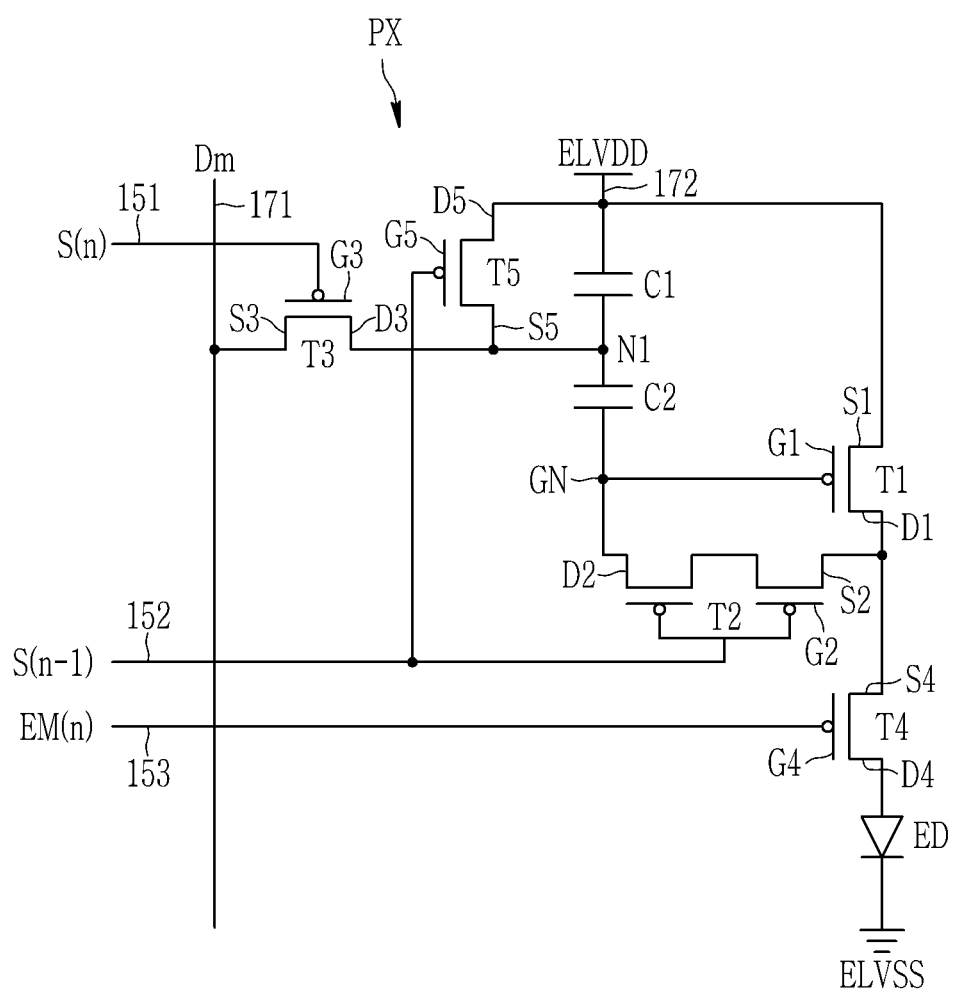
FIG. 1 is an equivalent circuit diagram for one pixel of a display device constructed according to an exemplary embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Throughout this specification and the claims which follow, a plan view means a view when observing a surface parallel to two directions (e.g., a direction DR1 and a direction DR2) intersecting each other, and a cross-sectional view means a view when observing a surface cut in a direction (e.g., a direction DR3) perpendicular to the surface parallel to the direction DR1 and the direction DR2. Also, to overlap two constituent elements means that two constituent elements are overlapped in the direction DR3 (e.g., a direction perpendicular to an upper surface of the substrate) unless stated otherwise.

Next, a display device constructed according to exemplary embodiment of the invention is described with reference to FIG. 1.

FIG. 1 is an equivalent circuit diagram for one pixel of a display device constructed according to an exemplary embodiment.

Referring to FIG. 1, a pixel PX of a display device constructed according to an exemplary embodiment may include a plurality of signal lines 151, 152, 153, 171, and 172, a plurality of transistors T1, T2, T3, T4, and T5 connected thereto, a plurality of capacitors C1 and C2, and a light-emitting element including, e.g., at least one light emitting diode (LED) ED. In the illustrated embodiment, for example, it is described that one pixel PX includes one light emitting diode (LED) ED.

The signal lines 151, 152, 153, 171, and 172 may include a plurality of scan lines 151 and 152, a control line 153, a data line 171, and a driving voltage line 172.

The scan lines 151 and 152 may transmit scan signals S(n) and S(n−1) (n is a natural number of 1 or more), respectively. The scan signals S(n) and S(n−1) may transmit a gate-on voltage that is capable of turning on the transistors T2, T3, and T5 included in the pixel PX.

The scan lines 151 and 152 connected to one pixel PX may include a first scan line 151 transmitting the scan signal S(n) and a second scan line 152 for transmitting the scan signal S(n−1) transmitting the gate-on voltage at different timing (e.g., a previous timing) from the first scan line 151. For example, when the scan signal S(n) is an n-th scan signal of the scan signals applied during one frame, the scan signal S(n−1) may be an (n−1)-th scan signal, that is, a previous scan signal.

The control line 153 may transmit a control signal, particularly a light emitting control signal EM(n) for controlling emission of the light emitting diode (LED) ED included in the pixel PX.

The data line 171 may transmit a data signal Dm, and the driving voltage line 172 may transmit a driving voltage ELVDD. The data signal Dm may have different voltage levels according to an image signal input to the display device, and the driving voltage ELVDD may have a substantially predetermined voltage level.

The plurality of transistors T1, T2, T3, T4, and T5 included in one pixel PX may include a first transistor T1, a second transistor T2, a third transistor T3, a fourth transistor T4, and a fifth transistor T5.

The first scan line 151 may transmit the scan signal S(n) to the third transistor T3, the second scan line 152 may transmit the scan signal S(n−1) to the second transistor T2 and the fifth transistor T5, and the control line 153 may transmit the light emitting control signal EM(n) to the fourth transistor T4.

A gate electrode G1 of the first transistor T1 is connected to one terminal of the second capacitor C2 through a driving gate node GN, a source electrode S1 of the first transistor T1 is connected to the driving voltage line 172, and a drain electrode D1 of the first transistor T1 is connected to an anode of the light emitting diode (LED) ED via the fourth transistor T4. The first transistor T1 may supply a driving current corresponding to the voltage applied to the driving gate node GN, that is, the voltage charged to the first and second capacitors C1 and C2, to the light emitting diode (LED) ED through the fourth transistor T4.

A gate electrode G2 of the second transistor T2 is connected to the second scan line 152, and a source electrode S2 of the second transistor T2 is connected to the anode of the light emitting diode (LED) ED via the fourth transistor T4 while being connected to the drain electrode D1 of the first transistor T1. A drain electrode D2 of the second transistor T2 is connected to one terminal of the second capacitor C2 and the gate electrode G1 of the first transistor T1, that is, a driving gate node GN. The second transistor T2 is turned on depending on the scan signal S(n−1) transmitted through the second scan line 152 to connect the gate electrode G1 and the drain electrode D1 of the first transistor T1 to each other, thereby diode-connecting the first transistor T1.

A gate electrode G3 of the third transistor T3 is connected to the first scan line 151, a source electrode S3 of the third transistor T3 is connected to the data line 171, and a drain electrode D3 of the third transistor T3 is connected to a node N1 as the other terminal of the second capacitor C2. The other terminal of the second capacitor C2 or the node N1 may be one terminal of the first capacitor C1. The third transistor T3 may be turned on depending on the scan signal S(n) transmitted through the first scan line 151 to transmit the data signal Dm transmitted from the data line 171 to the other terminal of the second capacitor C2 and one terminal of the first capacitor C1, that is, the node N1.

A gate electrode G4 of the fourth transistor T4 is connected to the control line 153, a source electrode S4 of the fourth transistor T4 is connected to the drain electrode D1 of the first transistor T1 and the source electrode S2 of the second transistor T2, and a drain electrode D4 of the fourth transistor T4 is connected to the anode of the light emitting diode (LED) ED. The fourth transistor T4 is turned on depending on the light emitting control signal EM(n) transmitted through the control line 153 such that the driving voltage ELVDD may be compensated through the first transistor T1 to be transmitted to the light emitting diode (LED) ED.

A gate electrode G5 of the fifth transistor T5 is connected to the second scan line 152, a source electrode S5 of the fifth transistor T5 is connected to the node N1, and a drain electrode D5 of the fifth transistor T5 is connected to the driving voltage line 172.

The transistors T1, T2, T3, T4, and T5 may be P-type channel transistors such as a PMOS, however the invention is not limited thereto, and at least one of the transistors T1, T2, T3, T4, and T5 may be an N-type channel transistor. Also, the above-described source electrode and drain electrode divide two electrodes disposed on both sides of each channel of the transistors T1, T2, T3, T4, and T5, and the two electrodes may be exchanged.

The other terminal of the first capacitor C1 is connected to the driving voltage line 172, as above-described, and one terminal of the first capacitor C1 is connected to the other terminal of the second capacitor C2, that is, the node N1.

The cathode of the light emitting diode (LED) ED is connected to a common voltage ELVSS terminal transmitting a common voltage ELVSS.

An operation of the display device according to an exemplary embodiment is now described with reference to FIG. 2 along with FIG. 1. In the illustrated embodiment, it transistors T1, T2, T3, T4, and T5 are described as P-type channel transistors and the operation of one frame is described.

Figure 2:
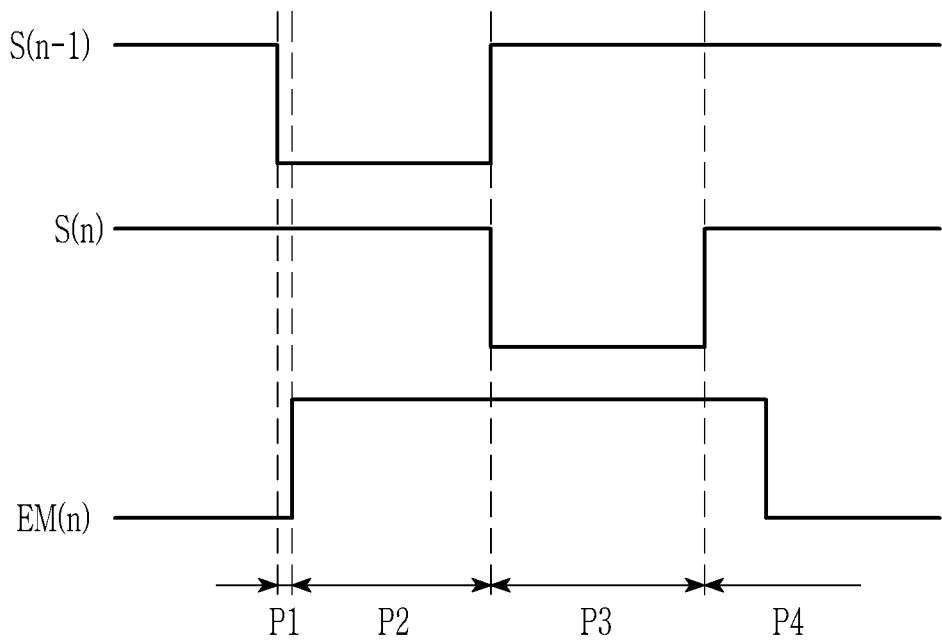
FIG. 2 is a timing diagram of driving signals of a display device according to an exemplary embodiment.
Figure 3:
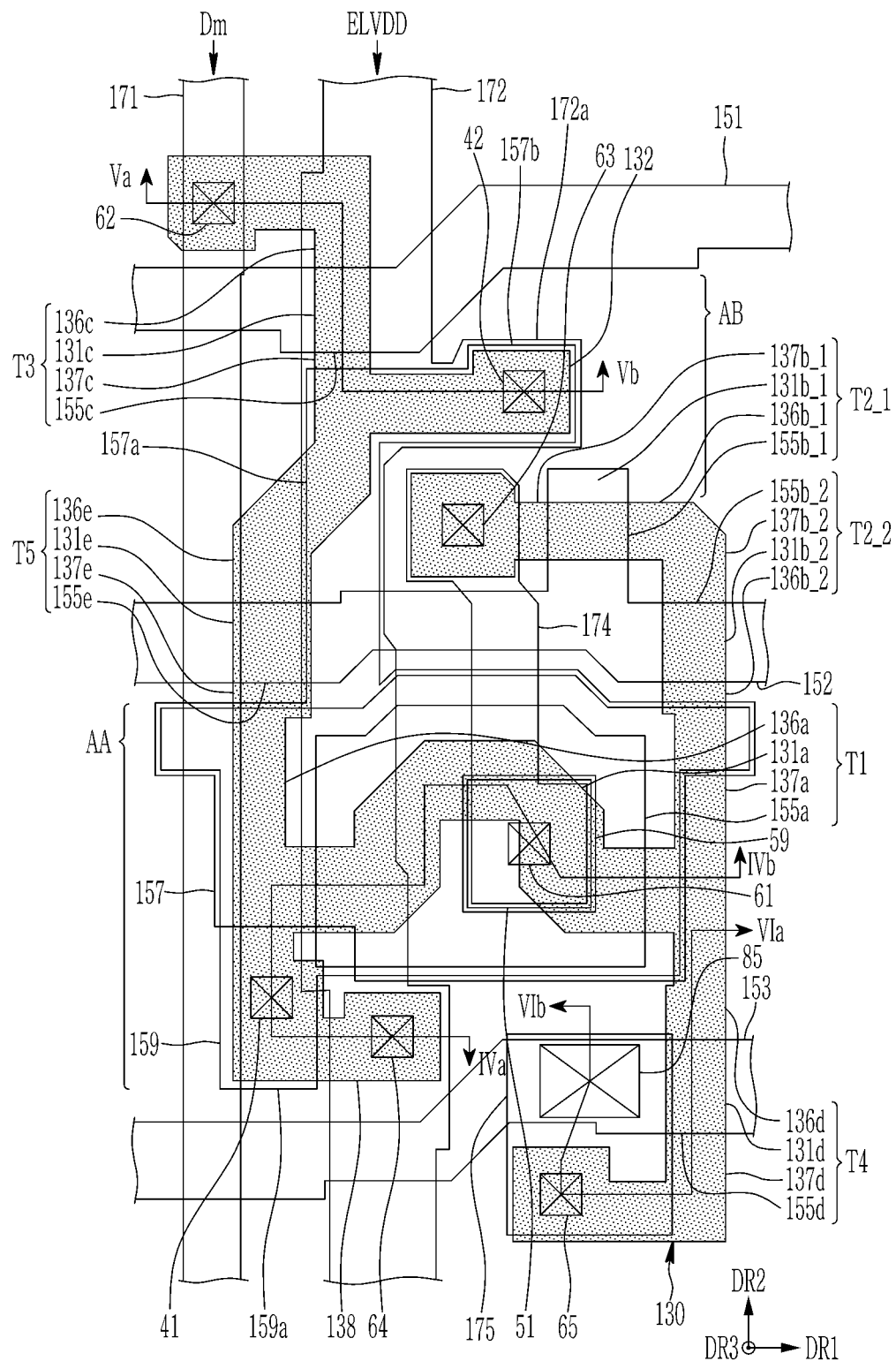
FIG. 3 is a top plan view for one pixel of a display device constructed according to an exemplary embodiment.
Figure 4:
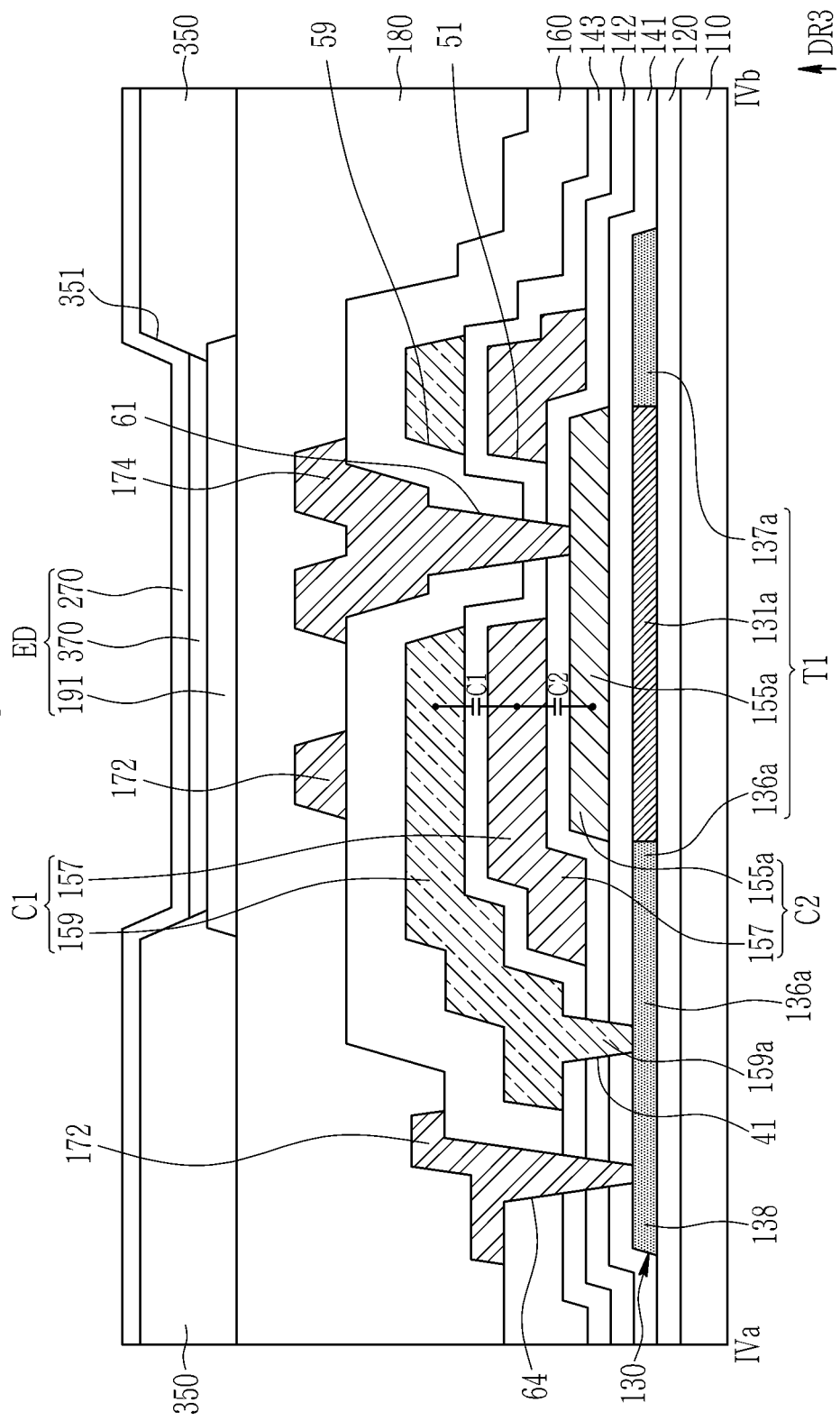
FIG. 4 is a cross-sectional view of the display device taken along a line IVa-IVb shown in FIG. 3.
Figure 5:
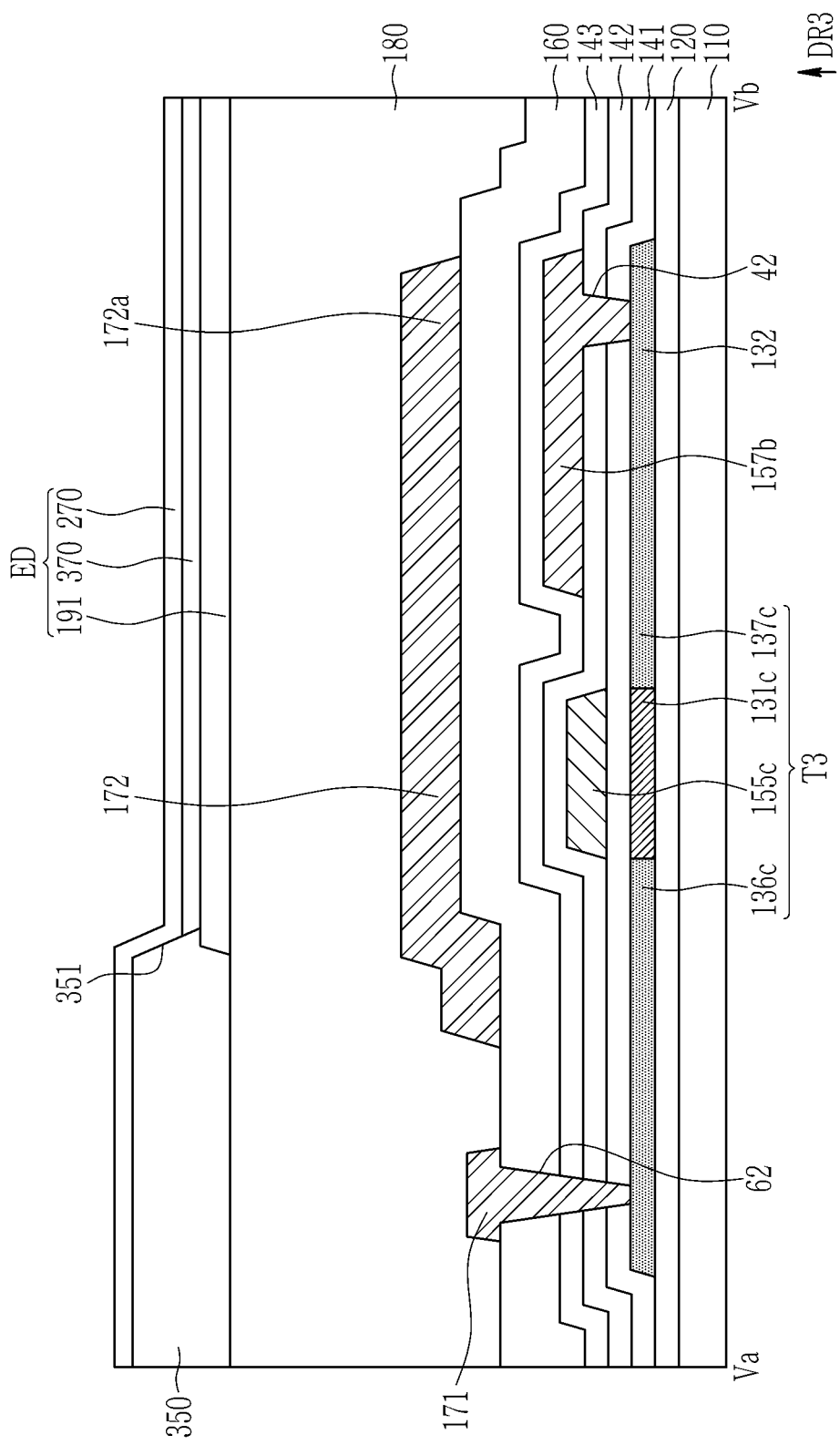
FIG. 5 is a cross-sectional view of the display device taken along a line Va-Vb shown in FIG. 3.
Figure 6:
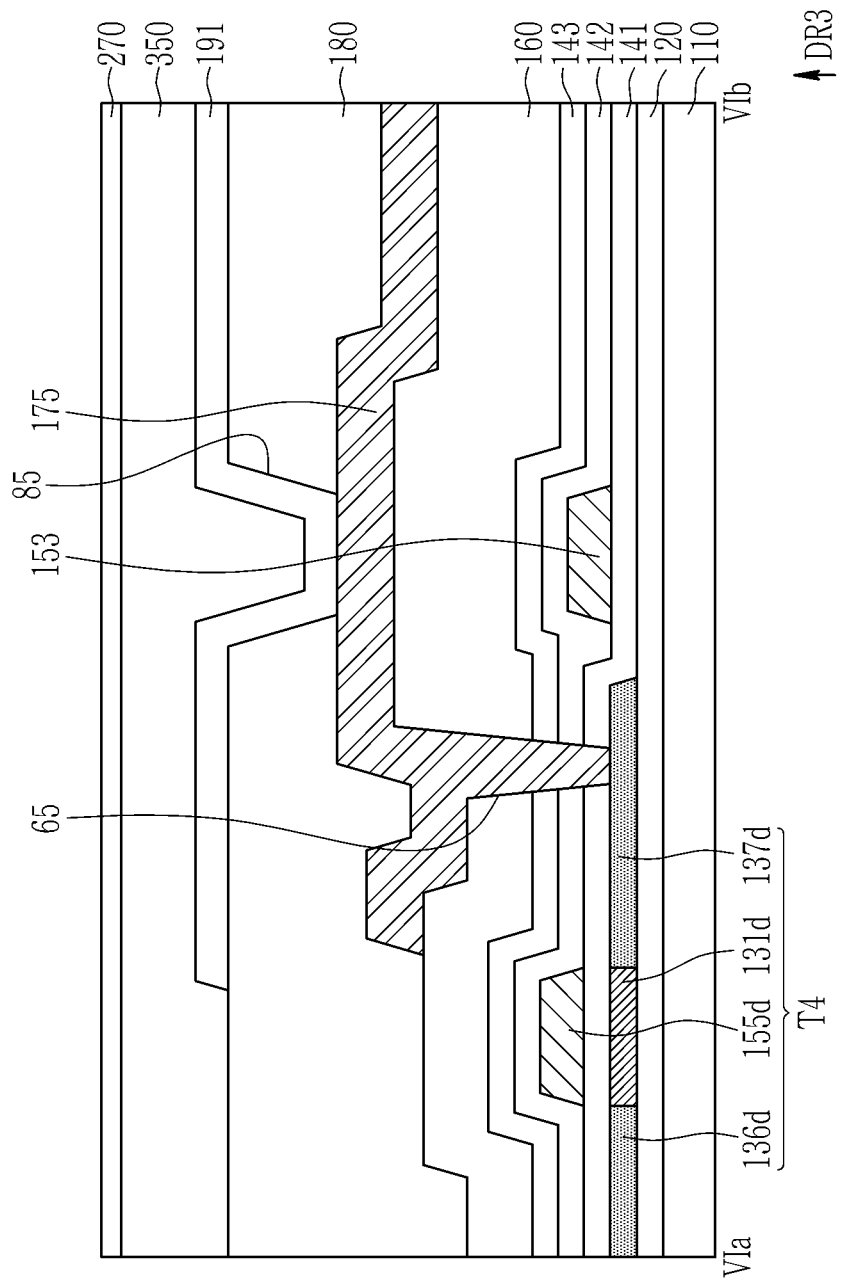
FIG. 6 is a cross-sectional view of the display device taken along a line VIa-VIb shown in FIG. 3.

Referring to FIG. 1 and FIG. 2, the scan signals (S(n−1) and Sn) of a low level may be sequentially applied to the plurality of scan lines 151 and 152 connected to the plurality of pixels PX within one frame. A part of the low level before the high level of the light emitting control signal EM (n) overlaps an initial part of the previous scan signal S(n−1), and the high level of the light emitting control signal EM(n) may overlap the rest of the period of the previous scan signal S(n−1) and the entire scan signal S(n).

First, in a first period P1 in which the previous scan signal S(n−1) of the low level is applied to the second scan line 152 while the light emitting control signal EM(n) is at the low level before the high level, the second transistor T2 and the fifth transistor T5 are turned on when the fourth transistor T4 is turned on. Thus, the first transistor T1 is diode-connected by the turned-on second transistor T2 such that the gate electrode G1 of the first transistor T1 is electrically connected to the light emitting diode (LED) ED via the turned-on second transistor T2. Accordingly, the gate electrode G1 of the first transistor T1, that is, the driving gate node GN, may be initialized into the approximate driving voltage ELVDD. Accordingly, the first period P1 is referred to as an initialization period.

Next, in the period in which the previous scan signal S(n−1) of the low level is applied to the second scan line 152, in the second period P2 in which the light emitting control signal EM(n) is the high level, the fourth transistor T4 is turned when the second and fifth transistors T2 and T5 are turned on. Thus, a compensation voltage (ELVDD−Vth) obtained by subtracting the threshold voltage Vth of the first transistor T1 from the driving voltage ELVDD is applied to the gate electrode G1 of the first transistor T1 that is diode-connected by the second transistor T2. Also, the driving voltage ELVDD is applied to the node N1 by the fifth transistor T5 that is turned on during the second period P2 and the voltage corresponding to the threshold voltage of the first transistor T1 is charged to the second capacitor C2. Therefore, the second period P2 is referred to as a compensation period.

Next, the scan signal S(n) of the low level is applied to the first scan line 151 while the light emitting control signal EM(n) is at the high level, and in the third period P3 in which the application of the previous scan signal S(n−1) to the second scan line 152 is stopped, the second and fifth transistors T2 and T5 are turned off and the third transistor T3 is turned on. The data signal Dm is applied to the node N1 through the turned-on third transistor T3. Accordingly, the voltage of the node N1 drops to the voltage of the data signal Dm from the driving voltage ELVDD, and the voltage of the driving gate node GN also drops corresponding to the voltage drop (ELVDD−Dm) of the node N1 (ELVDD−Vth−(ELVDD−Dm)). While the voltage charged to the second capacitor C2 during the third period P3 is stably maintained, the first capacitor C1 charges a predetermined voltage corresponding to the data signal Dm applied to the node N1. Accordingly, the third period P3 is referred to as to a writing period.

Next, after the application of the scan signal S(n) to the first scan line 151 is stopped, if the light emitting control signal EM(n) of the low level is applied to the control line 153 as a fourth period P4, the fourth transistor T4 is turned on. Thus, a driving current depending on a voltage difference of the voltage (Dm−Vth) of the gate electrode G1 of the first transistor T1 and the driving voltage ELVDD is generated, and the driving current is supplied to the light emitting diode (LED) ED through the turned-on fourth transistor T4, thereby allowing the current to flow to the light emitting diode (LED) ED. The gate-source voltage Vgs of the first transistor T1 is maintained as ELVDD−(Dm−Vth) during the fourth period P4, and the driving current may be proportional to the square (ELVDD−Dm)$^2$ of a value obtained by subtracting the threshold voltage Vth from the gate-source voltage (ELVDD−(Dm−Vth)) depending on the current-voltage relationship of the first transistor T1. Accordingly, the driving current of the light emitting diode (LED) ED may be determined regardless of the threshold voltage Vth of the first transistor T1. The fourth period P4 is referred to as a light emitting period.

Next, a detailed structure of the display device constructed according to an exemplary embodiment is described with reference to FIG. 3 to FIG. 6 along with FIG. 1 and FIG. 2 described above.

The display device according to an exemplary embodiment may include a substrate 110. The substrate 110 may include an insulating material such as glass, plastic, etc., and may have flexibility. For example, the substrate 110 may include various plastics, metal thin films, or glass thin films such as polyethylene terephthalate (PET), polyethylene naphthalate (PEN), polycarbonate (PC), polyarylate (PAR), polyether imide (PEI), polyether sulfone (PES), polyimide (PI), etc.

A barrier layer 120 may be positioned on the substrate 110 and an active pattern 130 may be positioned thereon. The active pattern 130 may include channel regions 131a, 131b_1, 131b_2, 131c, 131d, and 131e, which respectively form each channel of the plurality of transistors T1, T2_1, T2_2, T3, T4, and T5 included in one pixel PX, and conductive regions. The conductive regions of the active pattern 130 may include source regions 136a, 136b_1, 136b_2, 136c, 136d, and 136e and drain regions 137a, 137b_1, 137b_2, 137c, 137d, and 137e disposed at respective sides of each of the channel regions 131a, 131b_1, 131b_2, 131c, 131d, and 131e of the transistors T1, T2_1, T2_2, T3, T4, and T5, and conductive parts 132 and 138. When indicating the conductive parts, each conductive part may be referred to as a conductive region.

The active pattern 130 may include a semiconductor material such as amorphous silicon, polysilicon, or an oxide semiconductor.

A first insulating layer 141 may be disposed on the active pattern 130, and a first conductive layer may be disposed on the first insulating layer 141. The first conductive layer may include the plurality of scan lines 151 and 152, the control lines 153, and a driving gate electrode 155a. The plurality of scan lines 151 and 152 and control lines 153 may substantially extend in the first direction DR1. The driving gate electrode 155a may be disposed between the second scan line 152 and the control line 153.

The active pattern 130 disposed in one pixel PX may be connected in one body, and may cross the first scan line 151, the second scan line 152, and the control line 153 and extend beyond the respective lines. The conductive part 132 of the active pattern 130 may be disposed between the first scan line 151 and the second scan line 152, and may substantially extend in the first direction DR1. The conductive part 138 of the active pattern 130 may be disposed between the second scan line 152 and the control line 153, and may be disposed in a space between the driving gate electrode 155a and the control line 153.

A second insulating layer 142 may be disposed on the first conductive layer and the first insulating layer 141, and a second conductive layer may be disposed on the second insulating layer 142. The second conductive layer may include a first storage electrode 157 and first and second extending parts 157a and 157b connected thereto.

The first storage electrode 157 overlaps the driving gate electrode 155a. The first storage electrode 157 includes a hole 51 disposed on the driving gate electrode 155a, and may overlap most of the driving gate electrode 155a in the region except for the hole 51.

The first extending part 157a protrudes from the part of the first storage electrode 157 overlapping the driving gate electrode 155a and substantially extends in the second direction DR2 to cross the second scan line 152, and the second extending part 157b is connected to the first extending part 157a and may substantially extend in the first direction DR1. The end of the second extending part 157b may form an extension. The first and second extending parts 157a and 157b may not overlap and cross the first scan line 151. The second extending part 157b may be disposed between the first scan line 151 and the second scan line 152. The first and second extending parts 157a and 157b are conductive.

A third insulating layer 143 may be disposed on the second conductive layer and the second insulating layer 142, and a third conductive layer may be disposed on the third insulating layer 143. The third conductive layer may include a second storage electrode 159. The second storage electrode 159 may be disposed between the second scan line 152 and the control line 153. The second storage electrode 159 overlaps the first storage electrode 157. The first storage electrode 157 may be overlapped by most of the second storage electrode 159. The second storage electrode 159 may include a protrusion 159a which does not overlap the driving gate electrode 155a and the first storage electrode 157. The protrusion 159a may overlap the part of the conductive part 138 as the conductive region of the active pattern 130 in a plan view.

The second storage electrode 159 may include a hole 59 disposed on the driving gate electrode 155a. The hole 59 overlaps the hole 51 of the first storage electrode 157 in a plan view. The shape of the two holes 51 and 59 in a plan view may be quite similar, and the hole 59 of the second storage electrode 159 may be larger than the hole 51 of the first storage electrode 157 in a plan view.

A fourth insulating layer 160 may be disposed on the third insulating layer 143 and the third conductive layer.

At least one of the barrier layer 120, the first insulating layer 141, the second insulating layer 142, the third insulating layer 143, and the fourth insulating layer 160 may include an inorganic insulating material such as a silicon nitride ($SiN_x$), a silicon oxide ($SiO_x$), a silicon oxynitride (SiON), and/or an organic insulating material.

A part or all of the first insulating layer 141, the second insulating layer 142, the third insulating layer 143, and the fourth insulating layer 160 may include a plurality of contact holes 41, 42, 61, 62, 63, 64, and 65.

A fourth conductive layer may be disposed on the fourth insulating layer 160. The fourth conductive layer may include a plurality of connecting members 174 and 175 connected to the source regions 136a, 136b_1, 136b_2, 136c, 136d, and 136e or the drain regions 137a, 137b_1, 137b_2, 137c, 137d, and 137e of the active pattern 130, a data line 171, and a driving voltage line 172.

The data line 171 and the driving voltage line 172 substantially extend in the second direction DR2 in a plan view, thereby intersecting the plurality of scan lines 151 and 152 and the control line 153.

The driving voltage line 172 may include a protrusion 172a protruded in the first direction DR1 between the first scan line 151 and the second scan line 152. That is, the protrusion 172a may protrude from the main part of the driving voltage line 172 mainly extending in the second direction DR2, such that the protrusion 172a protrudes in a different direction from an extending direction of the main part of the driving voltage line 172. The protrusion 172a may cover the conductive part 132 of the active pattern 130 and may overlap the conductive part 132.

The driving voltage line 172 may overlap the conductive part 138 of the active pattern 130, and may be electrically connected to the conductive part 138 of the active pattern 130 through the contact hole 64 of the insulating layers 141, 142, 143, and 160. Accordingly, the conductive part 138 of the active pattern 130 may receive the driving voltage ELVDD from the driving voltage line 172. The protrusion 159a of the second storage electrode 159 is electrically connected to the conductive part 138 through the contact hole 41 of the insulating layers 141, 142, and 143. Accordingly, the second storage electrode 159 may receive the driving voltage ELVDD from the driving voltage line 172 through the conductive part 138, and the second storage electrode 159 may form the other terminal of the first capacitor C1 described above.

The contact hole 64 and the contact hole 41 may be separated from each other in a plan view. However, other arrangements are possible. For example, the contact hole 64 and the contact hole 41 may overlap each other in a plan view. In this case, the protrusion 159a may overlap the driving voltage line 172, or the driving voltage line 172 may include a separate protrusion overlapping the protrusion 159a.

The first transistor T1 includes the channel region 131a, the source region 136a and the drain region 137a, and the driving gate electrode 155a. The driving gate electrode 155a may be electrically connected to the connecting member 174 through the contact hole 61 of the insulating layers 142, 143, and 160. The contact hole 61 may be positioned in the hole 51 of the first storage electrode 157 and the hole 59 of the second storage electrode 159. That is, in a plan view, the contact hole 61 may overlap the two holes 51 and 59. The source region 136a of the first transistor T1 is electrically connected to the conductive part 138, thereby receiving the driving voltage ELVDD from the driving voltage line 172.

The second transistors T2_1 and T2_2 may include an upper second transistor T2_1 and a lower second transistor T2_2 connected to each other. The upper second transistor T2_1 and the lower second transistor T2_2 may form the above-described second transistor T2.

The upper second transistor T2_1 includes the channel region 131b_1, the source region 136b_1, the drain region 137b_1, and a gate electrode 155b_1 as part of the second scan line 152. The drain region 137b_1 is electrically connected to the connecting member 174 through the contact hole 63. The lower second transistor T2_2 includes the channel region 131b_2, the source region 136b_2 and the drain region 137b_2, and the gate electrode 155b_2 as part of the second scan line 152. The source region 136b_2 of the lower second transistor T2_2 is connected to the drain region 137a of the first transistor T1.

The third transistor T3 includes the channel region 131c, the source region 136c, and the drain region 137c, and a gate electrode 155c as part of the first scan line 151. The source region 136c is electrically connected to the data line 171 through the contact hole 62 of the insulating layers 141, 142, 143, and 160, and the drain region 137c is connected to the conductive part 132.

The fourth transistor T4 includes the channel region 131d, the source region 136d, and the drain region 137d, and a gate electrode 155d as part of the control line 153. The source region 136d is connected to the drain region 137a of the first transistor T1, and the drain region 137d is electrically connected to the connecting member 175 through the contact hole 65 of the insulating layers 141, 142, 143, and 160.

The fifth transistor T5 includes the channel region 131e, the source region 136e, and the drain region 137e, and a gate electrode 155e as part of the second scan line 152. The source region 136e is connected to the drain region 137c of the third transistor T3 and the conductive part 132, and the drain region 137e is connected to the source region 136a of the first transistor T1. The drain region 137e of the fifth transistor T5 is electrically connected to the conductive part 138, thereby receiving the driving voltage ELVDD from the driving voltage line 172.

The conductive part 132 may be electrically connected to the extension of the second extending part 157b of the first storage electrode 157 through the contact hole 42 of the insulating layers 141 and 142. Accordingly, the first storage electrode 157 is electrically connected to the drain region 137c of the third transistor T3 connected to the conductive part 132 and the source region 136e of the fifth transistor T5, and the first storage electrode 157, the drain region 137c of the third transistor T3, and the source region 136e of the fifth transistor T5 form the above-described node N1.

The first storage electrode 157 included in one pixel PX overlaps the driving gate electrode 155a via the second insulating layer 142 to form the second capacitor C2, and the second storage electrode 159 overlaps the first storage electrode 157 via the third insulating layer 143 to form the first capacitor C1. Accordingly, the first capacitor C1 and the second capacitor C2 coupled in series may be formed between the second storage electrode 159 and the driving gate electrode 155a. Particularly, because these first and second capacitors C1 and C2 are formed to overlap in a plan view in one space AA, a space advantage may be gained, and the area occupied by one pixel PX in a plan view may be reduced by that space, thereby obtaining a pixel structure with high resolution.

Also, in a space AS where the third transistor T3 and the fifth transistor T5 are connected, the conductive part 132 of the active pattern 130 is electrically connected to the second extending part 157b of the first storage electrode 157, thereby forming the above-described node N1. The conductive part 132 of the active pattern 130 in the space AB is covered by the protrusion 172a of the driving voltage line 172, thereby preventing the external light from reaching the active pattern 130. Accordingly, the leakage current due to the light may be prevented from being generated, such that display defects such as a luminance change of the image and a color coordinate change may be prevented.

At least one of the first conductive layer, the second conductive layer, the third conductive layer, and the fourth conductive layer may include at least one metal such as copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), alloys thereof, etc. Each of the first conductive layer, the second conductive layer, the third conductive layer, and the fourth conductive layer may include a single layer or a multi-layer.

A passivation layer 180 as a fifth insulating layer may be disposed on the fourth insulating layer 160 and the fourth conductive layer. The passivation layer 180 may include the inorganic insulating material and/or the organic insulating material such as a polyimide, an acryl-based polymer, and a siloxane-based polymer. The upper surface of the passivation layer 180 may be substantially flat. The passivation layer 180 may include a contact hole 85 disposed on the connecting member 175.

A pixel electrode layer may be disposed on the passivation layer 180 of the fifth insulating layer. The pixel electrode layer may include a pixel electrode 191 corresponding to each pixel PX. The pixel electrode 191 is connected to the connecting member 175 through the contact hole 85 of the passivation layer 180, thereby receiving the data voltage. The pixel electrode layer may include a semi-transmissive conductive material layer or a reflective conductive material.

A sixth insulating layer 350 may be disposed on the passivation layer 180. The sixth insulating layer 350 has an opening 351 disposed on the pixel electrode 191. Accordingly, the sixth insulating layer 350 is referred to as a pixel defining layer. The sixth insulating layer 350 may include the organic insulating material such as a polyacryl-based resin, a polyimide-based resin, etc.

An emission layer 370 is disposed on the pixel electrode 191. The emission layer 370 may include a part disposed in the opening 351 of the sixth insulating layer 350. The emission layer 370 may include an organic light emitting material or an inorganic light emitting material.

A common electrode 270 is disposed on the emission layer 370. The common electrode 270 is also formed on the sixth insulating layer 350, thereby being continuously formed throughout the plurality of pixels PX. The common electrode 270 may receive the common voltage ELVSS. The common electrode 270 may include a conductive transparent material.

The pixel electrode 191, the emission layer 370, and the common electrode 270 of each pixel PX form together the light emitting diode (LED) ED, where one of the pixel electrode 191 and the common electrode 270 becomes the cathode, and the other becomes the anode.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a substrate;
   a first transistor disposed on the substrate, the first transistor including a channel region, a gate electrode, a first electrode electrically connected to a driving voltage line, and a second electrode;
   a second transistor including a gate electrode, a first electrode electrically connected to the second electrode of the first transistor, and a second electrode electrically connected to the gate electrode of the first transistor;
   a third transistor including a gate electrode electrically connected to a first scan line, a first electrode electrically connected to a data line, and a second electrode electrically connected to a first node;
   a fifth transistor including a gate electrode electrically connected to a second scan line, a first electrode electrically connected to the first node, and a second electrode electrically connected to the driving voltage line;
   a first capacitor including a first terminal electrically connected to the first node, and a second terminal electrically connected to the driving voltage line; and
   a second capacitor including a first terminal electrically connected to the gate electrode of the first transistor, and a second terminal electrically connected to the first node,
   wherein the first capacitor and the second capacitor overlap the first transistor in a plan view, and
   the first capacitor and the second capacitor overlap each other over the first transistor in the plan view.

2. The display device of claim 1, further comprising:
   a fourth transistor including a gate electrode electrically connected to a control line, a first electrode electrically connected to the second electrode of the first transistor, and a second electrode; and
   a light emitting diode electrically connected to the second electrode of the fourth transistor.

3. The display device of claim 2, wherein the first capacitor and the second capacitor overlap the channel region of the first transistor in the plan view.

4. The display device of claim 2, wherein:
the first terminal of the first capacitor comprises a first storage electrode,
the second terminal of the first capacitor comprises a second storage electrode,
the first terminal of the second capacitor comprises the gate electrode of the first transistor, and
the second terminal of the second capacitor comprises the first storage electrode.

5. The display device of claim 4, further comprising:
a first insulating layer disposed on the channel region;
a second insulating layer disposed on the gate electrode of the first transistor; and
a third insulating layer disposed on the first storage electrode,
wherein:
the first capacitor further comprises the third insulating layer between the first storage electrode and the second storage electrode, and
the second capacitor further comprises the second insulating layer between the first storage electrode and the gate electrode of the first transistor.

6. The display device of claim 4, wherein the gate electrode of the first transistor, the first storage electrode, and the second storage electrode overlap each other in the plan view.

7. The display device of claim 4, wherein the gate electrode of the first transistor, the first storage electrode, and the second storage electrode are disposed between the second scan line and the control line in the plan view.

8. The display device of claim 4, wherein:
the first storage electrode comprises an extension electrically connected to the first electrode of the fifth transistor, and
the extension intersects the second scan line in the plan view.

9. The display device of claim 4, wherein the driving voltage line intersects the first scan line, the second scan line, and the control line, and
wherein the second storage electrode is electrically connected to the second electrode of the fifth transistor.

10. The display device of claim 9, wherein:
the driving voltage line comprises a first part intersecting the first scan line and a protrusion extending in a different direction from an extending direction of the first part, and
the protrusion overlaps the first electrode of the fifth transistor.

* * * * *